US010067521B2

(12) United States Patent
Wang et al.

(10) Patent No.: US 10,067,521 B2
(45) Date of Patent: Sep. 4, 2018

(54) LOW DROPOUT REGULATOR WITH PMOS POWER TRANSISTOR

(71) Applicant: Realtek Semiconductor Corp., Hsinchu (TW)

(72) Inventors: Shih-Wei Wang, Hua Lien (TW); Chih-Chien Chang, Tai Pei (TW); Hsiang-An Yang, Hsin Pei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 15/344,967

(22) Filed: Nov. 7, 2016

(65) Prior Publication Data

US 2017/0293313 A1   Oct. 12, 2017

(30) Foreign Application Priority Data

Apr. 12, 2016  (TW) .............................. 105111383 A

(51) Int. Cl.
*G05F 1/575*       (2006.01)
*H03F 3/45*        (2006.01)

(52) U.S. Cl.
CPC ......... *G05F 1/575* (2013.01); *H03F 3/45071* (2013.01); *H03F 3/45206* (2013.01); *H03F 2203/45116* (2013.01)

(58) Field of Classification Search
CPC .................. G05F 1/575; H03F 3/45071; H03F 2203/45116
See application file for complete search history.

(56) References Cited

U.S. PATENT DOCUMENTS

| 6,310,467 B1* | 10/2001 | Sauer ...................... G05F 1/575 |
| | | 323/273 |
| 6,580,257 B2* | 6/2003 | Marty ...................... G05F 1/573 |
| | | 323/277 |

(Continued)

FOREIGN PATENT DOCUMENTS

CN          104391533 A        3/2015

OTHER PUBLICATIONS

Pui Ying Or and Ka Nang Liung , "A Fast-Transient Low-Dropout Regulator With Load-Tracking Impedance Adjustmnet and Loop-Gain Boosting Technique", IEEE Transactions on circuits and systems II, Oct. 2010, pp. 757-761., vol. 57,No. 10,IEEE,Shatin,Hongkong.

(Continued)

*Primary Examiner* — Emily P Pham
(74) *Attorney, Agent, or Firm* — Muncy, Geissler, Olds & Lowe, P.C.

(57) ABSTRACT

A low dropout regulator includes a PMOS power transistor, a feedback network, an error amplifier and an active enhanced PSRR unit. The PMOS power transistor has a first end coupled to an input voltage, and a second end coupled to a load and the feedback network. The error amplifier receives a feedback signal generated from the feedback network, compares the feedback signal with a reference voltage to generate a difference value, and amplifies the difference value to generate an error signal. The active enhanced PSRR unit has one end coupled to the first end, and another end coupled to a control end of the PMOS power transistor and the error amplifier, detects an input voltage of the first end, and correspondingly adjusts a voltage of the control end to stabilize a voltage between the control end and the first end according to a variation of the input voltage.

7 Claims, 7 Drawing Sheets

(56) References Cited

U.S. PATENT DOCUMENTS

| | | | | |
|---|---|---|---|---|
| 7,224,155 B2* | 5/2007 | Bo | ............ | G05F 1/573 |
| | | | | 323/312 |
| 7,602,162 B2* | 10/2009 | Bansal | ............ | G05F 1/573 |
| | | | | 323/277 |
| 9,000,857 B2* | 4/2015 | Lahiri | ............ | H03L 7/0995 |
| | | | | 327/541 |
| 2003/0011952 A1* | 1/2003 | Fukui | ............ | G05F 1/573 |
| | | | | 361/93.1 |

OTHER PUBLICATIONS

Chia-Hsiang Lin, Ke-Horng Chen, Hong-Wei Huang, "Low-Dropout Regulators With Adaptive Reference Control and Dynamic Push-Pull Techniques for Enha", IEEE Transactions on Power Electronics, Apr. 2009, pp. 1016-1022, vol. 24, No. 4, Hsinchu, Taiwan.

Phillip E. Allen and Douglas R. Holberg, "CMOS Analog Circuit Design," Oxford, 2002, p. 153,Oxford University Press, Canada.

Behzad Razavi, "Design of Analog CMOS Integrated Circuits," Jul. 17, 2000,p. 386, McGraw Hill, Boston.

* cited by examiner

LOW DROPOUT REGULATOR WITH PMOS POWER TRANSISTOR

BACKGROUND OF THE INVENTION

This application claims priority of No. 105111383 filed in Taiwan R.O.C. on Apr. 12, 2016 under 35 USC 119, the entire content of which is hereby incorporated by reference.

FIELD OF THE INVENTION

The invention relates to a low dropout regulator, and more particularly to a low dropout regulator, which has a PMOS power transistor and utilizes an active enhanced PSRR mechanism to stabilize the voltage.

DESCRIPTION OF THE RELATED ART

Power application circuits for supplying the power to portable electronic apparatuses, vehicle electronics or medical apparatuses need the stable voltage with the low noise, wherein a power supply rejection ratio (PSRR) of each of these application circuits is very important. A low dropout regulator (LDO) is suitable for use in the application circuit, and needs to reject the noise from the high-speed digital circuit, the dropout converter or other switch circuits on the chip. The PSRR data of the LDR is for quantitating the rejection ability of the LDR with respect to the different frequencies of input power ripples, and reflects the ability of the LDR for keeping the output voltage stable without being affected by the noise and voltage fluctuations. The PSRR is defined as the ratio of the amplitude of the ripple of the output voltage to the amplitude of the ripple of the input voltage. Thus, the lower PSSR represents the higher performance.

FIG. 1 shows a conventional low dropout regulator (LDR) 100 with a P-type metal-oxide semiconductor (PMOS) power transistor. The LDR 100 includes a PMOS power transistor 101, a load 102, a feedback network 103 and an error amplifier 104. The LDR 100 has the poor noise rejection ability on the input voltage source VIN because the fluctuation of the input voltage source VIN directly affects the gate-source voltage VGS of the PMOS power transistor, wherein (gate-source voltage VGS)=(gate voltage VG)−(input voltage VIN), and the gate-source voltage VGS directly changes the current variation of the PMOS power transistor 101. Thus, when the input voltage VIN varies, the output voltage of the LDR can be easily affected, thereby causing the poor PSRR, or the too high instantaneous gate-source voltage VGS causes the burning out of the PMOS power transistor 101.

SUMMARY OF THE INVENTION

One of the objects of the invention is to provide a low dropout regulator, which has a PMOS power transistor and has an active enhanced PSRR mechanism.

According to one embodiment of the invention, a low dropout regulator is provided. The low dropout regulator includes a PMOS power transistor, a feedback network, an error amplifier and an active enhanced PSRR unit. The PMOS power transistor has a first end coupled to an input voltage, and a second end coupled to a load. The feedback network is coupled to the second end of the PMOS power transistor. The error amplifier receives a feedback signal generated from the feedback network, compares the feedback signal with a reference voltage to generate a difference value, and amplifies the difference value to generate an error signal. The active enhanced PSRR unit has one end coupled to the first end of the PMOS power transistor, and another end coupled to a control end of the PMOS power transistor and the error amplifier. An input voltage of the first end of the PMOS power transistor is detected, and a voltage of the control end is correspondingly adjusted according to a variation of the input voltage to stabilize a voltage between the control end and the first end.

According to another embodiment of the invention, a low dropout regulating method is provided and includes the steps of: providing a PMOS power transistor having a first end coupled to an input voltage, and a second end coupled to a load; detecting an input voltage of the first end of the PMOS power transistor, and correspondingly adjusting a voltage of a control end of the PMOS power transistor according to a variation of the input voltage to stabilize a voltage between the control end and the first end.

When the input voltage varies, the low dropout regulator according to the embodiment of the invention actively detects the noise of the input voltage, and actively stabilizes the gate-source voltage VGS of the PMOS power transistor to solve the conventional problems that the PSRR is poor, or that the too high instantaneous gate-source voltage VGS causes the burning out of the PMOS power transistor.

DETAILED DESCRIPTION OF THE INVENTION

Figure 1:
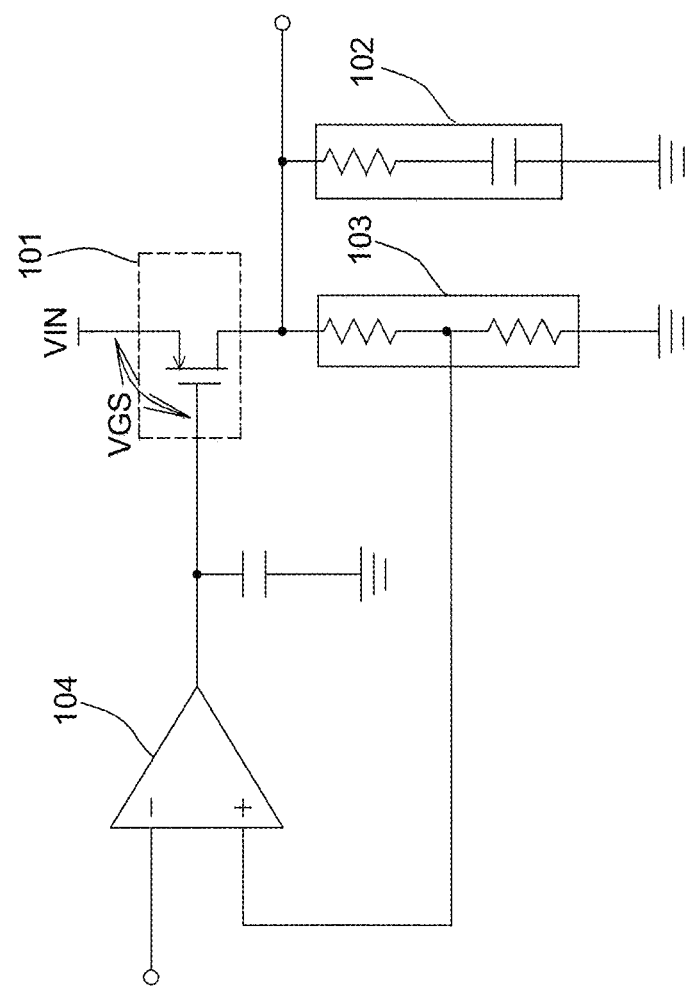
FIG. 1 is a schematic view showing a conventional low dropout regulator with a PMOS power transistor.
Figure 2A:
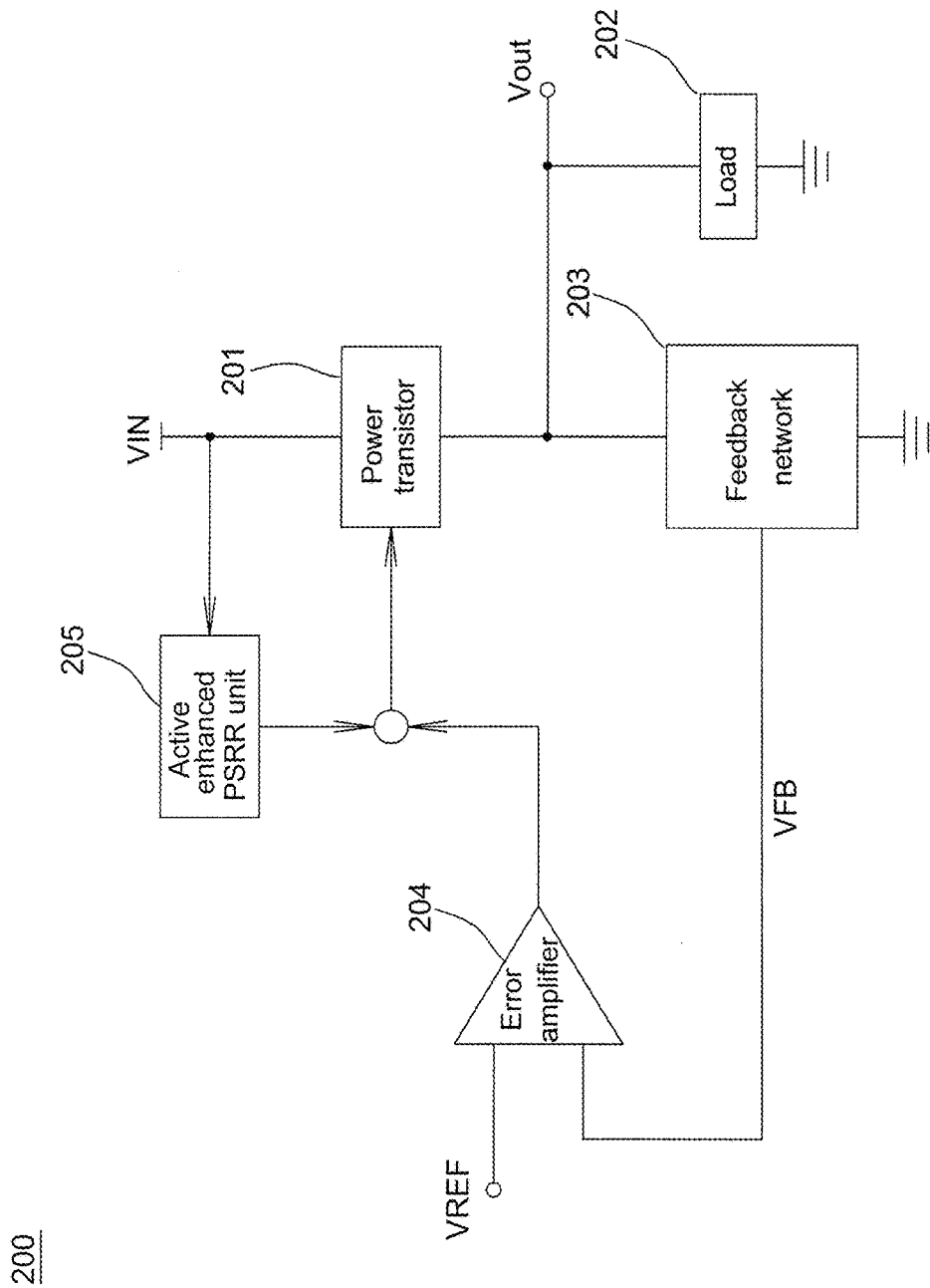
FIG. 2A is a schematic view showing a low dropout regulator with a PMOS power transistor according to an embodiment of the invention.
Figure 2B:
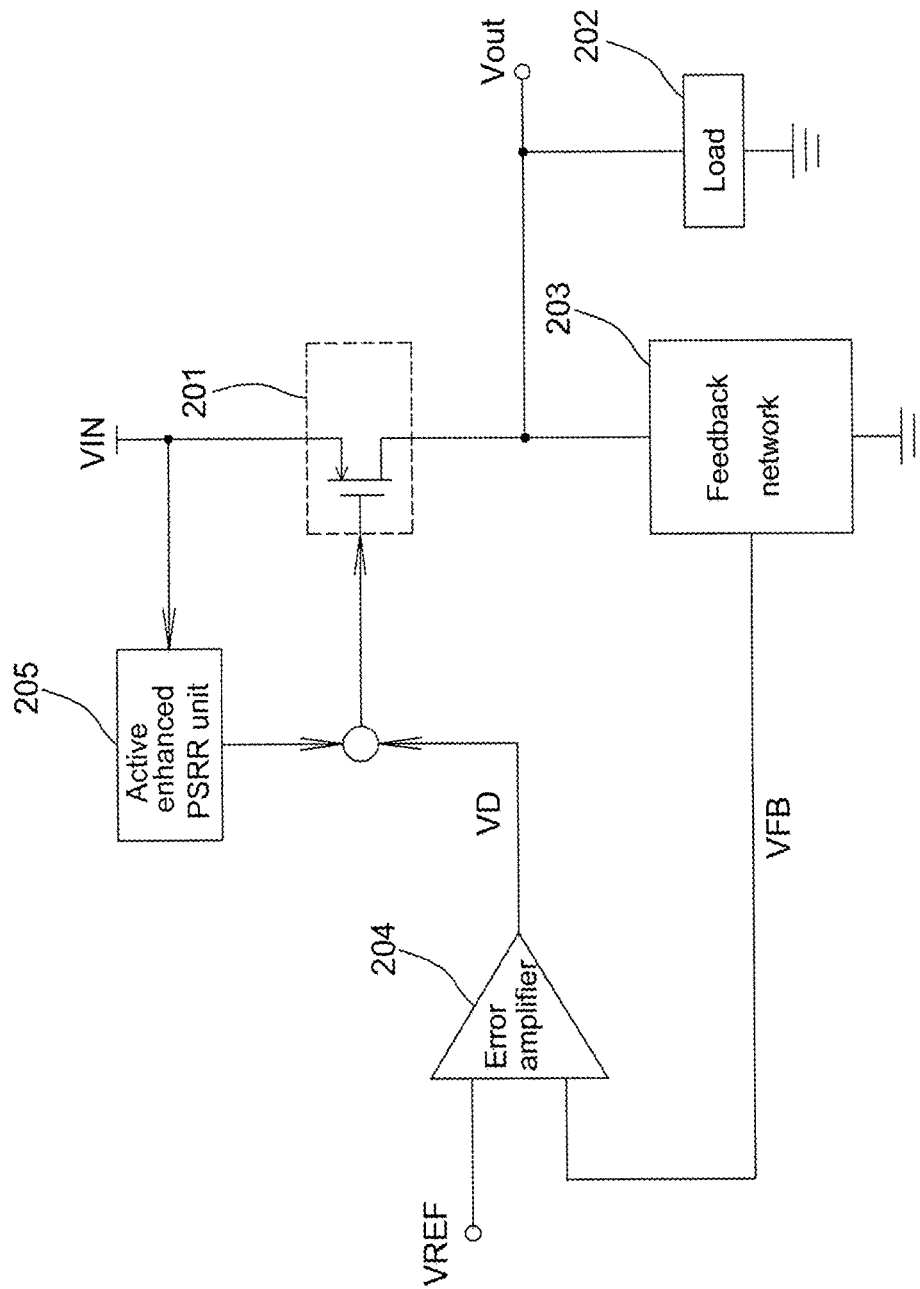
FIG. 2B is a schematic view showing a low dropout regulator with a PMOS power transistor according to another embodiment of the invention.

FIGS. 2A and 2B show a low dropout regulator 200 according to an embodiment of the invention. The low dropout regulator 200 includes a reference voltage source (not shown), a PMOS power transistor 201, a load 202, a feedback network 203, an error amplifier 204 and an active enhanced PSRR unit 205.

The reference voltage source is for providing a precise reference voltage VREF.

The PMOS power transistor 201, as shown in the example of FIG. 2B, has a source (first end) coupled to an input voltage VIN, a drain (second end) coupled to the load 202, and a gate (control end) receiving signals of the active enhanced PSRR unit 205 and the error amplifier 204. When the low dropout regulator 200 is operating, the input voltage VIN provides energy to an output terminal Vout through the PMOS power transistor so that the output terminal Vout can reach the designed voltage value.

The feedback network 203 is coupled to the drain of the PMOS power transistor 201.

The error amplifier 204 receives a feedback signal VFB generated by the feedback network 203, compares the feedback signal VFB with the reference voltage VREF to generate a difference value, and amplifies the difference value to generate an error signal VD.

The active enhanced PSRR unit 205 has one end coupled to the source of the PMOS power transistor 201, and another end coupled to the gate of the PMOS power transistor and the error amplifier 204. The active enhanced PSRR unit 205 is for detecting the input voltage VIN of the source of the PMOS power transistor 201, and correspondingly adjusting a gate voltage of the PMOS power transistor 201 according to a variation of the input voltage VIN to stabilize the gate-source voltage VGS. In detail, the active enhanced PSRR unit 205 functions as an active control circuit for the gate of the PMOS power transistor 201 to directly reflect the noise of the input voltage VIN on the gate of the PMOS power transistor, and to ensure that the noise cannot affect the gate-source voltage value VGS of the PMOS power transistor, so that the output voltage of the low dropout regulator is free from being affected by the input voltage noise, and the PSRR of the low dropout regulator can be thus improved.

In one embodiment of the invention, the active enhanced PSRR unit 205 performs up tracking, wherein when the noise of the input voltage VIN is up, the active enhanced PSRR unit 205 reflects an equivalent voltage difference of the up noise on the gate of the PMOS power transistor 201 to ensure that the gate-source voltage VGS of the PMOS power transistor 201 cannot fluctuate due to the noise of the input voltage VIN. In another embodiment of the invention, the active enhanced PSRR unit 205 performs down tracking, wherein when the noise of the input voltage VIN is down, the active enhanced PSRR unit 205 reflects an equivalent voltage difference of the down noise on the gate of the PMOS power transistor 201 to ensure that the gate-source voltage VGS of the PMOS power transistor 201 cannot fluctuate due to the noise of the input voltage VIN.

Figure 3:
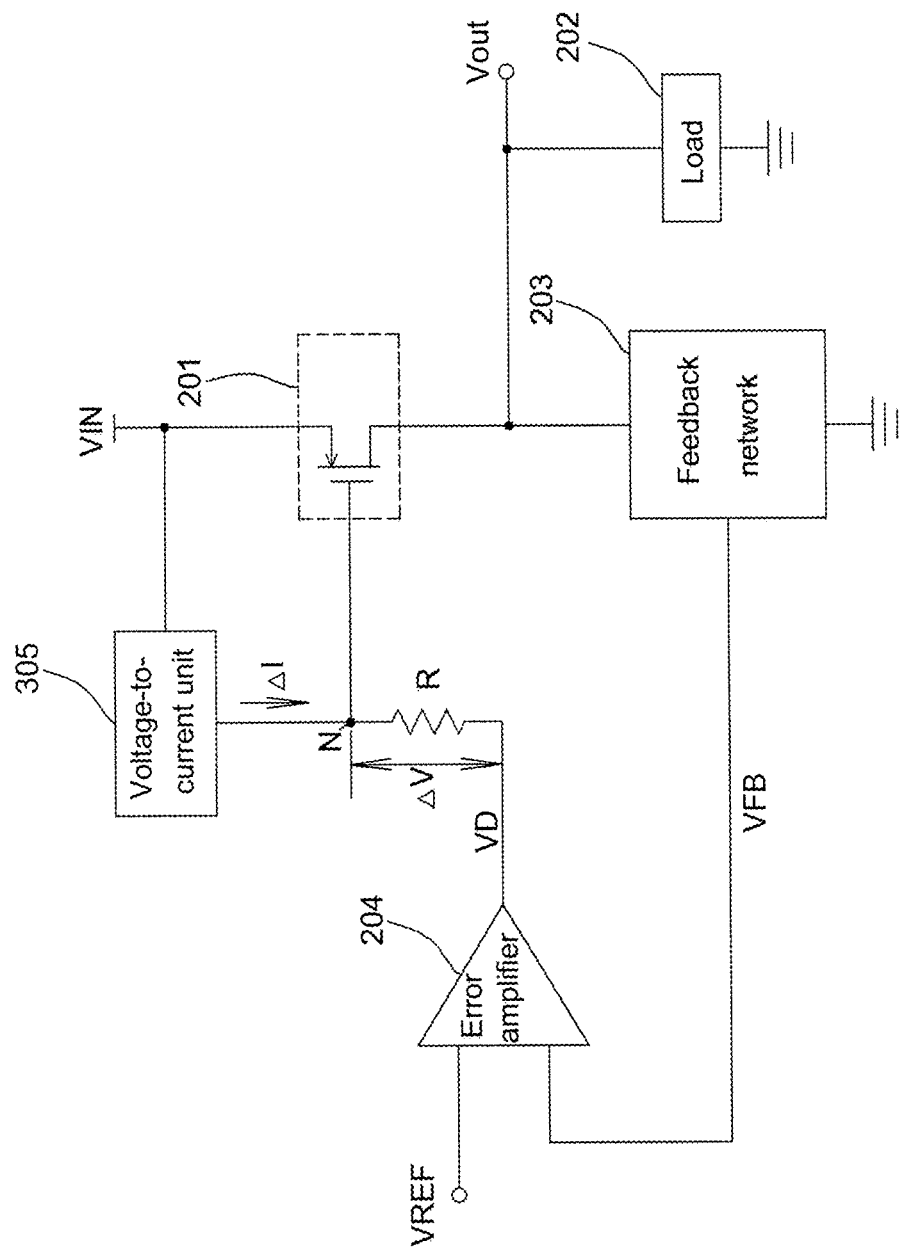
FIG. 3 is a schematic view showing a low dropout regulator with a PMOS power transistor according to another embodiment of the invention.

In one embodiment of the invention, the active enhanced PSRR unit 205 may be a voltage-to-current unit or a voltage-to-voltage unit. FIG. 3 is a schematic view showing the active enhanced PSRR unit 205 of the invention is implemented by a voltage-to-current unit 305. When the voltage-to-current unit 305 detects a noise variation $\Delta VIN$ of the input voltage VIN, the voltage-to-current unit 305 generates a current difference $\Delta I$ according to the noise variation $\Delta VIN$ of the input voltage VIN, the current difference $\Delta I$ flows through the resistor R to generate an equivalent voltage difference $\Delta V$, provided to the gate of the PMOS power transistor 201, at a node N, so that the gate voltage of the PMOS power transistor can follow the variation of the source voltage, and the gate-source voltage VGS of the PMOS power transistor 201 can be thus stabilized.

Figure 4:
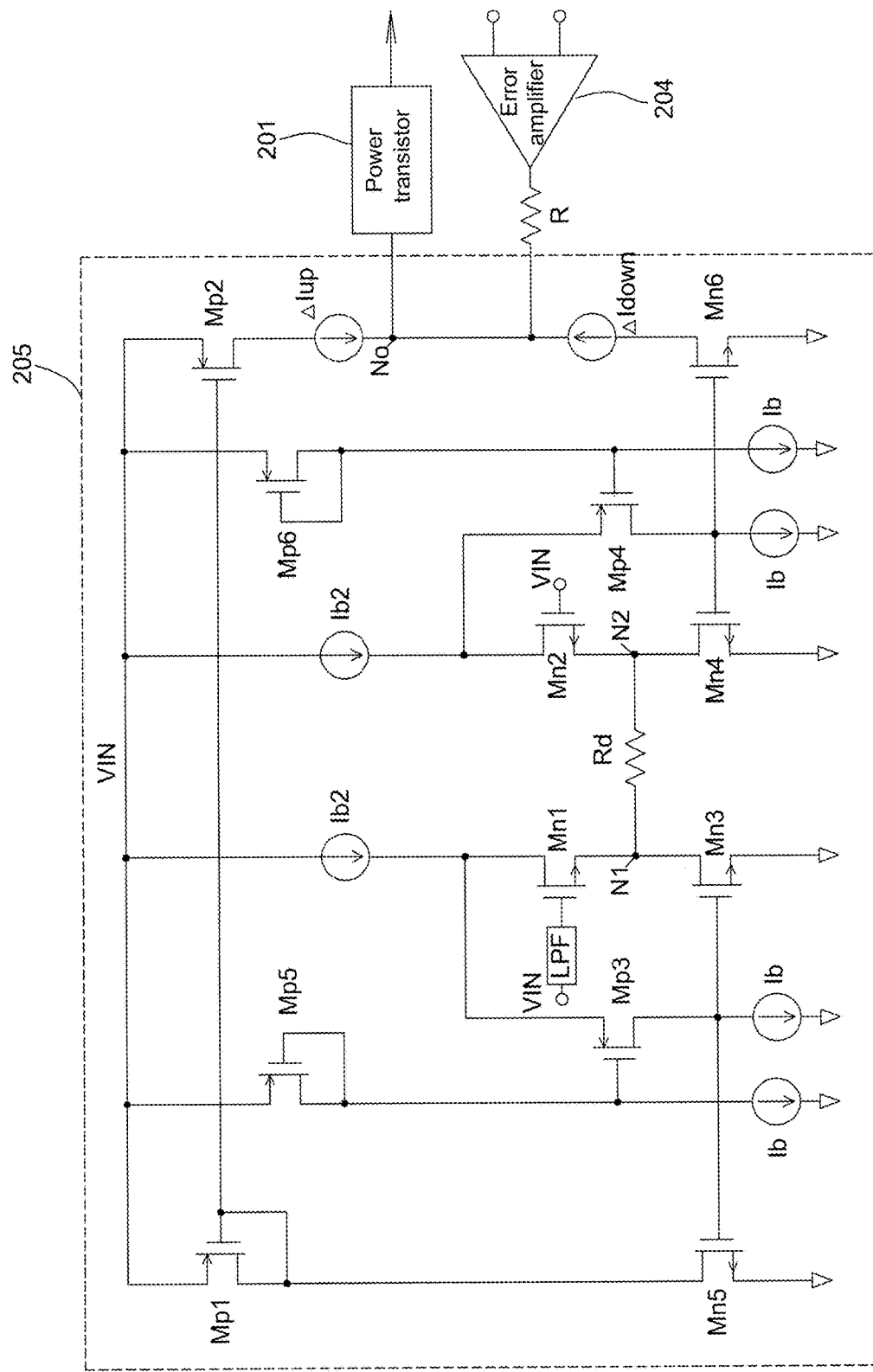
FIG. 4 is a schematic view showing an active enhanced PSRR unit according to an embodiment of the invention.

FIG. 4 is a schematic view showing an active enhanced PSRR unit 205 according to an embodiment of the invention. In this embodiment, the active enhanced PSRR unit 205 is divided into two circuits according to a middle resistor Rd at a middle point, wherein a first circuit on a left side includes a first NMOS transistor Mn1, a third NMOS transistor Mn3, a fifth NMOS transistor Mn5, a first PMOS transistor Mp1, a third PMOS transistor Mp3, a fifth PMOS transistor Mp5, three first current sources Ib, Ib and Ib2 and a low-pass filter LPF.

A second circuit on a right side includes a second NMOS transistor Mn2, a fourth NMOS transistor Mn4, a sixth NMOS transistor Mn6, a second PMOS transistor Mp2, a fourth PMOS transistor Mp4, a sixth PMOS transistor Mp6 and three second current sources Ib, Ib and Ib2.

The middle resistor Rd has a first node N1 coupled to the first circuit, and a second node N2 coupled to the second circuit.

The elements of the first circuit on the left side except for the low-pass filter LPF are symmetrical with respect to the elements of the second circuit on the right side. In detail, the first NMOS transistor Mn1, the third NMOS transistor Mn3 and the fifth NMOS transistor Mn5 are symmetrical with respect to the second NMOS transistor Mn2, the fourth NMOS transistor Mn4 and the sixth NMOS transistor Mn6, respectively. The first PMOS transistor Mp1, the third PMOS transistor Mp3 and the fifth PMOS transistor Mp5 are symmetrical with respect to the second PMOS transistor Mp2, the fourth PMOS transistor Mp4 and the sixth PMOS transistor Mp6, respectively. The three first current sources are symmetrical with respect to the three second current sources, respectively.

The input voltage VIN, including the noise, is inputted to the transistor Mn2 of the second circuit, and the second node N2 of the second circuit reflects the input voltage including the noise. Meanwhile, the input voltage VIN, including the noise, is inputted to the low-pass filter LPF of the first circuit. After the noise is filtered out, the filtered input voltage VIN is provided to the transistor Mn1, so that the first node N1 can receive the filtered input voltage without the noise. According to this method, the middle resistor Rd between the first node N1 and the second node N2 can obtain the level of the noise. Next, a current mirror formed between the first circuit and the second circuit reflects the noise to the output to generate the up current difference $\Delta Iup$ and the down current difference $\Delta Idown$. The up current difference $\Delta Iup$ and the down current difference $\Delta Idown$ flow through the resistor R coupled to the error amplifier 204, and finally the equivalent voltage difference $\Delta V$ is generated at the output node No and provided to the gate of the PMOS power transistor 201, so that the gate voltage of the PMOS power transistor can follow the variation of the source voltage to stabilize the gate-source voltage VGS of the PMOS power transistor 201.

Figure 5A:
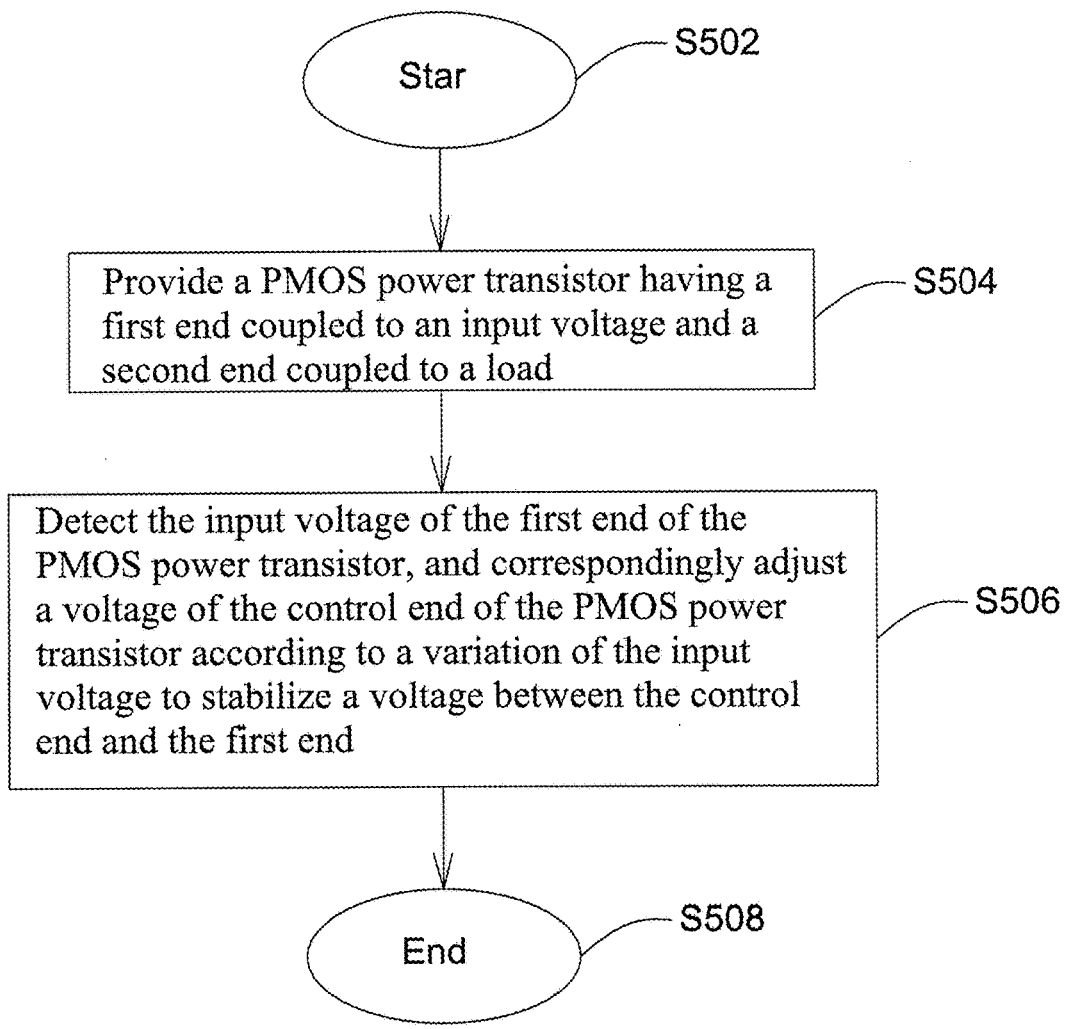
FIGS. 5A and 5B are flow charts showing a low dropout regulating method for a PMOS power transistor according to an embodiment of the invention.
Figure 5B:
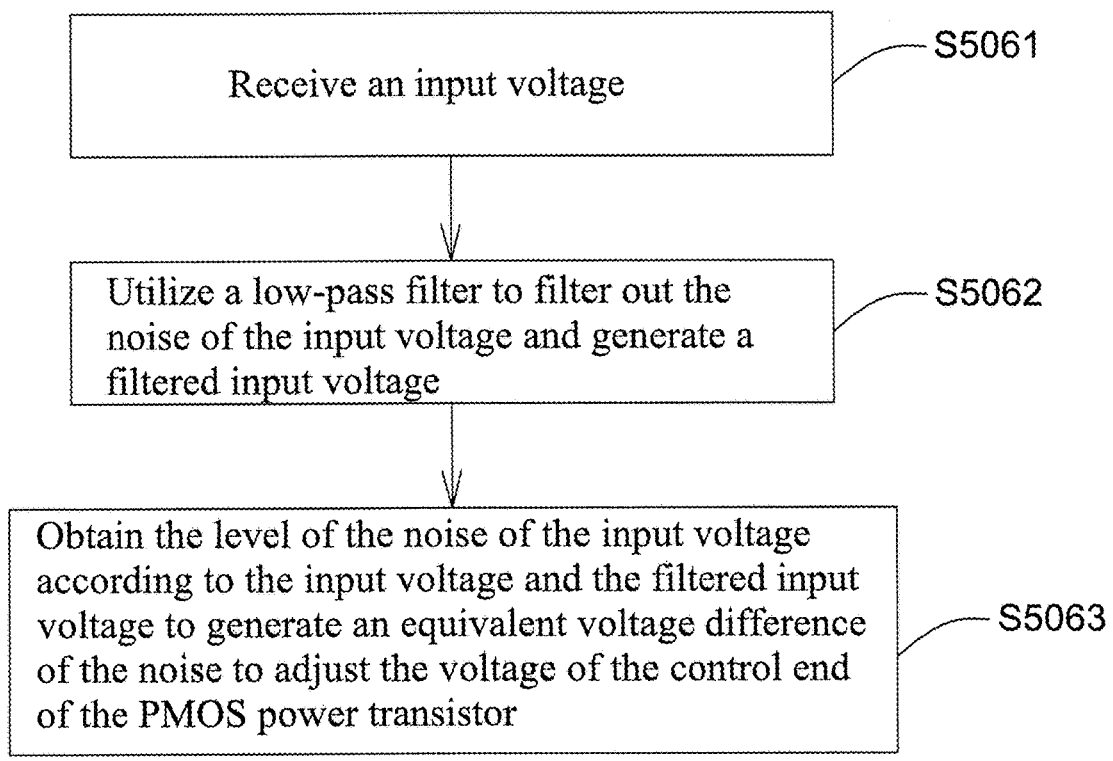

FIGS. 5A and 5B are flow charts showing a low dropout regulating method for a PMOS power transistor according to an embodiment of the invention. Referring to FIGS. 5A and 5B, the method includes the following steps.

In step S502, the method starts.

In step S504, a PMOS power transistor, having a first end coupled to an input voltage and a second end coupled to a load, is provided.

In step S506, the input voltage of the first end of the PMOS power transistor is detected, and a voltage of the control end of the PMOS power transistor is correspondingly adjusted according to a variation of the input voltage to stabilize a voltage between the control end and the first end. The first end of the PMOS power transistor is the source, the second end is the drain, the control end is the gate, the voltage of the control end is the gate voltage, and the voltage between the control end and the first end is the gate-source voltage.

In step S508, the method ends.

FIG. 5B shows sub-steps of the step S506, that is, the sub-steps of detecting the input voltage of the first end of the PMOS power transistor include the following steps.

In step S5061, the input voltage is received.

In step S5062, a low-pass filter is utilized to filter out the noise of the input voltage to generate a filtered input voltage.

In step S5063, the level of the noise of the input voltage is obtained according to the input voltage and the filtered input voltage to generate the equivalent voltage difference of the noise to adjust the voltage of the control end of the PMOS power transistor.

According to this method, the low dropout regulator of the PMOS power transistor according to the embodiment of the invention can solve the prior art problem that the PSRR is poor, or the instantaneous gate-source voltage VGS is too high to cause the burn out of the PMOS power transistor when the input voltage VIN is varying.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A low dropout regulator, comprising:
    a PMOS power transistor having a first end, a second end and a control end, wherein the first end is coupled to an input voltage, and the second end is coupled to a load;
    a feedback network coupled to the second end of the PMOS power transistor;
    an error amplifier for receiving a feedback signal generated from the feedback network, comparing the feedback signal with a reference voltage to generate an error signal; and
    an active enhanced PSRR unit having one end is coupled to the first end of the PMOS power transistor, and another end coupled to the control end of the PMOS power transistor and the error amplifier, wherein the active enhanced PSRR unit detects the input voltage of the first end of the PMOS power transistor, and correspondingly adjusts a voltage of the control end according to a variation of the input voltage,
    wherein the first end is a source, the second end is a drain, the control end is a gate, the voltage of the control end is a gate voltage, and the voltage between the control end and the first end is a gate-source voltage; the input voltage comprises a noise, and the active enhanced PSRR unit reflects an equivalent voltage difference of the noise on the gate of the PMOS power transistor.

2. The circuit according to claim 1, wherein the active enhanced PSRR unit is a voltage-to-current unit or a voltage-to-voltage unit.

3. The circuit according to claim 1, wherein the active enhanced PSRR unit comprises:
    a first circuit comprising a first NMOS transistor, a third NMOS transistor, a fifth NMOS transistor, a first PMOS transistor, a third PMOS transistor, a fifth PMOS transistor, three first current sources and a low-pass filter;
    a second circuit comprising a second NMOS transistor, a fourth NMOS transistor, a sixth NMOS transistor, a second PMOS transistor, a fourth PMOS transistor, a sixth PMOS transistor and three second current sources; and
    a middle resistor having a first node coupled to the first circuit, and a second node coupled to the second circuit;
    wherein the first NMOS transistor, the third NMOS transistor and the fifth NMOS transistor are symmetrical with respect to the second NMOS transistor, the fourth NMOS transistor and the sixth NMOS transistor, respectively; the first PMOS transistor, the third PMOS transistor and the fifth PMOS transistor are symmetrical with respect to the second PMOS transistor, the fourth PMOS transistor and the sixth PMOS transistor, respectively; and the three first current sources are symmetrical with respect to the three second current sources, respectively.

4. The circuit according to claim 3, wherein the input voltage comprises a noise, the input voltage is inputted to the second NMOS transistor of the second circuit, and the second node coupled to the second circuit reflects the input voltage comprising the noise; and the input voltage is inputted to the low-pass filter of the first circuit, the low-pass filter filters out the noise of the input voltage to generate a filtered input voltage, and then provides the filtered input voltage to the first NMOS transistor, so that the first node receives the filtered input voltage.

5. The circuit according to claim 4, wherein the active enhanced PSRR unit obtains the noise of the input voltage between the first node and the second node, and utilizes the first circuit and the second circuit to generate and provide an up current difference and a down current difference to the control end of the PMOS power transistor to stabilize a voltage between the control end and the first end.

6. A low dropout regulating method, comprising the steps of:
    providing a PMOS power transistor having a first end, a second end and a control end, wherein the first end is coupled to an input voltage, and the second end is coupled to a load; and
    detecting the input voltage of the first end of the PMOS power transistor, and correspondingly adjusting a voltage of the control end of the PMOS power transistor according to a variation of the input voltage,
    wherein said detecting the input voltage of the first end of the PMOS power transistor comprises:
    receiving the input voltage;
    utilizing a low-pass filter to filter out a noise of the input voltage to generate a filtered input voltage; and
    obtaining a level of the noise of the input voltage according to the input voltage and the filtered input voltage to generate an equivalent voltage difference of the noise to adjust the voltage of the control end.

7. The method according to claim 6, wherein the first end is a source, the second end is a drain, and the control end is a gate.

* * * * *